United States Patent [19]

Knauer

[11] 4,434,371
[45] Feb. 28, 1984

[54] ELECTRON BEAM BLANKING APPARATUS AND METHOD

[75] Inventor: Wolfgang Knauer, Malibu, Calif.

[73] Assignee: Hughes Aircraft Company, El Segundo, Calif.

[21] Appl. No.: 354,846

[22] Filed: Mar. 4, 1982

[51] Int. Cl.³ .............................................. G21K 1/08
[52] U.S. Cl. .............................................. 250/396 R
[58] Field of Search ................ 250/396 R, 398, 492.2; 313/361.1, 421, 426, 433

[56] References Cited

U.S. PATENT DOCUMENTS 3,997,846 12/1976 Coultas et al. ...................... 328/229
4,130,761 12/1978 Matsuda ............................ 250/492.2
4,362,945 12/1982 Riecke ............................. 250/396 R Primary Examiner—Alfred E. Smith
Assistant Examiner—Constantine Hannaher
Attorney, Agent, or Firm—G. B. Rosenberg; D. W. Collins; A. W. Karambelas

[57] ABSTRACT

Beam deflection apparatus 50 has first and second conductors 64 and 68 positioned transversely in the path of beam 67 and has a resistive connector 78 to be tuned to deflection amplifier 52 and transmission line 54 to provide magnetic deflection. Capacitive plates 74 and 76 are charged by the deflection current to provide substantially equal electrostatic deflection in the same direction.

12 Claims, 4 Drawing Figures

ELECTRON BEAM BLANKING APPARATUS AND METHOD

TECHNICAL FIELD

This invention is directed to an apparatus for deflecting electron beam sufficiently away from the normal beam path that the beam is blanked, and particularly apparatus for high speed beam blanking, together with the method by which high speed blanking of the electron beam is achieved.

BACKGROUND OF THE INVENTION

In high speed submicron lithography, an electron beam is focused and imaged toward its target. The target is a sensitive material which is exposed by the beam to permit different states of treatment of the substrate underlying the sensitive material. Usually the material is photosensitive which includes sensitivity to electron and/or ion beams. The beam is deflected to form a writing path on the target to produce an exposure pattern thereon. There are writing requirements which necessitate that the beam be blanked during certain parts of the deflection, in order to write separate patterns on the substrate. This invention is directed to high speed blanking which does not slow down writing or misdirect the beam during writing.

There are two classes of electron beam equipment. In the first class, a small, high brightness electron source is focused, deflected and demagnified onto the target to produce a writing spot. This is considered to be a Gaussian beam because of the angular distribution of electrons from the high brightness source. The second class of electron beam equipment uses a source which floods an aperture to produce a specific beam shape. This flooded aperture is then focused, deflected and demagnified onto the target. In either case, a blanking deflector is positioned adjacent the beam to deflect the beam away from a blanking aperture sufficiently that little beam energy passes onto the target. The blanking deflector and blanking aperture thus achieve cutoff of the beam during non-writing portions of the operation.

SUMMARY OF THE INVENTION

In order to aid in the understanding of this invention it can be stated in essentially summary form that it is directed to an electron beam blanking apparatus for high speed blanking, and a method for high speed blanking. The apparatus comprises a tuned electrostatic and magnetic deflection unit which in the highest speed utilization is impedance matched with its transmission line and driver-amplifier.

It is thus a purpose and advantage of this invention to provide an electron beam blanking apparatus and method which includes electrostatic and magnetic beam deflection, and also impedance matching to its driver-amplifier.

Other purposes and advantages of this invention will become apparent from a study of the following portion of this specification, the claims and the attached drawings.

DESCRIPTION OF THE PREFERRED EMBODIMENT

Figure 1:
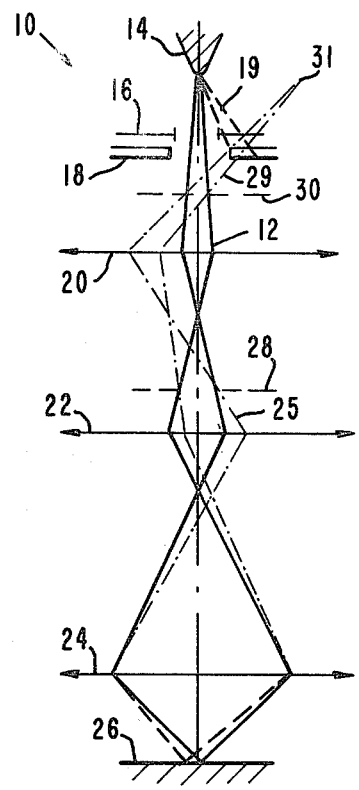
FIG. 1 is a schematic drawing of a Gaussian beam writing system, showing the beam blanking equipment of this invention therein.

FIG. 1 shows an electron beam lithography machine 10 having a Gaussian electron beam 12. The electron beam emitted from electron source 14 passes through blanking aperture 16 and then through blanking deflector 18. Beam 12 is focused by lenses 20 and 22 and is demagnified by lens 24 onto target 26. Lens 24 contains the final beam aperture, virtual image 25 of which exits at plane 28 imaged by lens 22 and virtual image 29 at plane 30 imaged by lens 20. The equivalent virtual source is indicated at 31.

In order to achieve blanking, the beam 12 must be deflected sufficiently far to miss the aperture hole in the blanking aperture 16. Typical Gaussian beam systems require deflection angles near $2.10^{-3}$ radians. With high-speed Gaussian beams, blanking times are in the range of 1 to 10 nanoseconds. Blanking is accomplished by applying beam deflecting energy to blanking deflector 18. In the blanked position, the equivalent ray path is shown in dashed lines. The dashed ray paths shown below aperture 16 are "virtual" and serve to indicate where the blanked beam would have to go if it were to pass through the final aperture (in plate 24).

Figure 2:
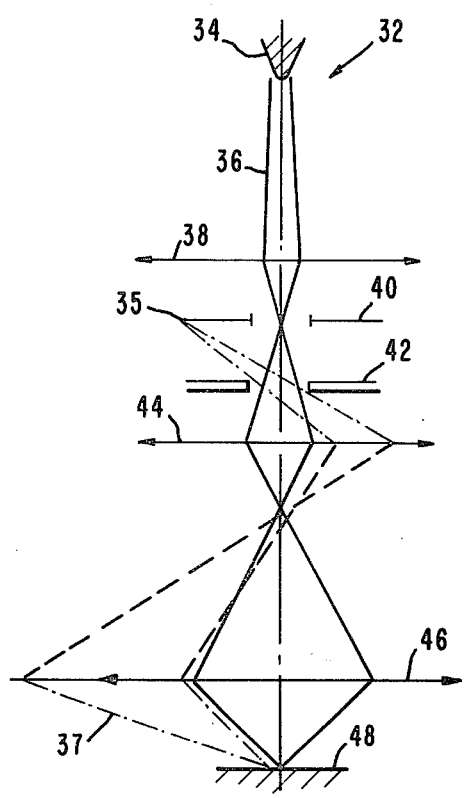
FIG. 2 is a schematic drawing of a shaped beam electron beam apparatus, showing the electron beam blanking apparatus of this invention positioned therein.

FIG. 2 is a schematic ray trace diagram of an electron beam machine 32 which provides a shaped beam to the target. Electron source 34 delivers electron beam 36 through lens 38 which focuses the beam toward beam shaper aperture 40. The beam 36 from source 34 is not as finely defined as in the Gaussian system, but the beam shaper aperture cuts off the sides of the beam so that the resultant electron beam below shaped aperture 30 is of selected shape and has well defined edges.

Blanking deflector 42 is positioned down the beam path to apply lateral force to the beam to direct it away from the target. Lenses 44 and 46 are sequentially positioned along the beam path toward 48, and the aperture in lens 46 acts as the blanking aperture. The dot-dashed lines below blanking deflector 42 indicate the virtual source 35 and virtual paths 37 of the deflected electron beam.

In shaped beam electron beam lithography machines spot exposure times are on the order of 10 to 1,000 nanoseconds, and blanking times must be approximately one order of magnitude shorter than the exposure time so that the spot edge definition is not reduced. Thus, blanking times for shaped beam systems should be in the range of 1 to 100 nanoseconds. This is the time from the beginning of the blanking pulse to the completion of beam swing out of the blanking aperture. The deflection angle in a typical shaped beam electron beam machine is about $1.10^{-3}$ radians.

The blanking deflectors 18 and 42 can be electrostatic plates. For a set of electrostatic deflection plates of reasonable size, the deflection angle given above for Gaussian beams and a beam energy of 20 thousand volts, the required driving voltage becomes 20 volts which exceeds the capability of state of the art drivers with nanosecond rise time. Thus, electrostatic deflection is not practical. If blanking is to be achieved by magnetic deflection, and if a single turn coil is considered to minimize self inductance, a coil of reasonable dimensions requires a coil current of approximately one ampere, which exceeds the capability of state of the art amplifiers which have nanosecond rise time.

One of the problems of electrostatic deflection is that the electrostatic plates are subject to voltage pulse reflections since they fail to provide a termination which matches the transmission line impedance. The reflected waves travel back and forth between the driver and the plates in tens of nanoseconds so that they can lead to periodic unblanking pulses until the wave energy has become dissipated.

In accordance with this invention, the blanking deflectors 18 and 42 are each shaped so that each provides electrostatic as well as magnetic deflection and also serves as a line termination.

Figure 3:
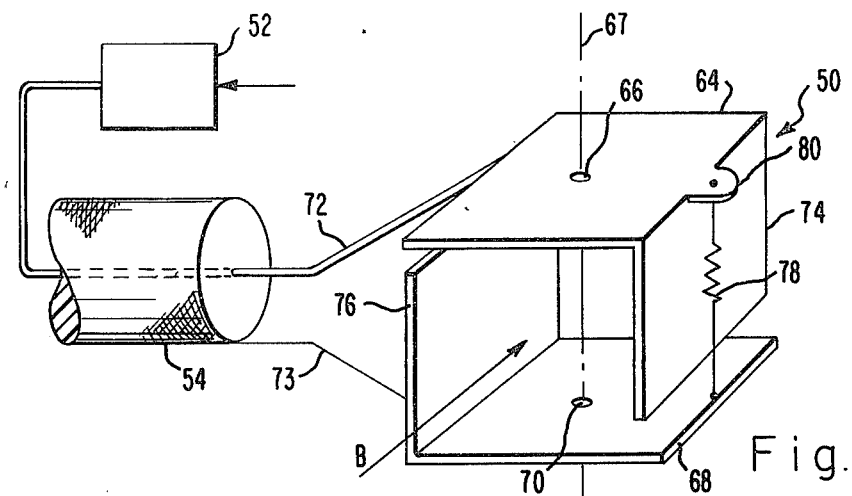
FIG. 3 is a combined electrostatic and magnetic beam deflection apparatus in accordance with this invention, impedance matched and coupled to a single transmission line.
Figure 4:
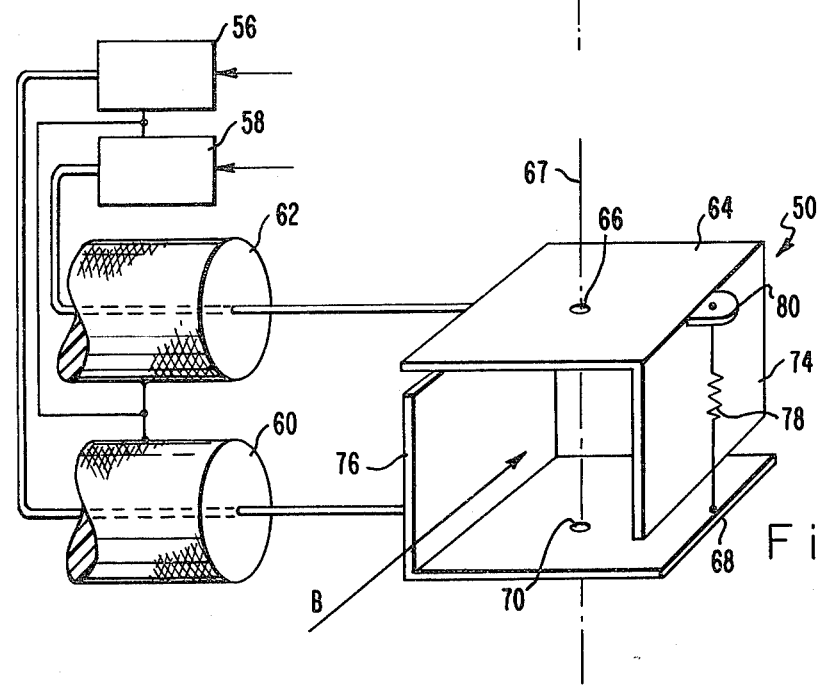
FIG. 4 is similar to FIG. 3, showing the apparatus linked to two transmission lines where the apparatus is used with twin amplifier drive.

FIGS. 3 and 4 illustrate the preferred embodient of the blanking apparatus 50. The blanking apparatus 50 is the same in both of these figures, and is the apparatus 18 in FIG. 1 and is the apparatus 42 in FIG. 2. In FIG. 3 apparatus 50 is shown as being connected to the output of one driver amplifier 52 through coaxial cable 54. In FIG. 4, blanking apparatus 50 is shown as being connected to differential twin driver amplifiers 56 and 58 respectively through coaxial cables 60 and 62.

As seen in FIGS. 3 and 4, upper plate 64 has a beam opening 66 for passage of the electron beam 67, which is the same as beams 12 and 36. The beam 67 is to be deflected away from the blanking aperture to cut off the beam. Upper plate 64 is preferably normal to the beam path, as is lower plate 68 with its beam opening 70. In FIG. 3, upper plate 64 is connected at its adjacent edge to center conductor 72 of coaxial cable 54, while lower plate 68 is connected at its adjacent edge to outer conductor 74 of the coaxial cable 64.

Secured to the outer edge of upper plate 64 and extending substantially parallel to the beam path 67 is outer deflection plate 74. Inner deflection plate 76 is substantially parallel to outer deflection plate 74 and on the opposite side of the beam path. Inner deflection plate 76 is connected to the inner edge of lower plate 68. In addition, resistor 78 interconnects the outer edges upper plate 64 and lower plate 68. As indicated in FIGS. 3 and 4, tab 80 is formed extending to the right of outer deflection plate 74 to hold resistor 78 away from plate 74. Similarly, plate 68 extends to the right of the plane defined by deflection plate 74, for resistor connection.

The structure in FIG. 3 is configured to produce both electrostatic and magnetic deflection. A one turn magnetic deflection coil is composed of conductor 72, upper plate 64, resistor 78 with its connections, lower plate 68 and outer conductor 73. This one turn magnetic deflection coil is a loop which is positioned in a plane substantially parallel to the beam path 67. When driver-amplifier 52 drives current around that single loop, a magnetic field is generated which causes deflection of beam 68. The deflection due to this magnetic field is in the direction normal to deflector plates 74 and 76, that is generally left to right in FIGS. 3 and 4. At the same time, the current charges up deflection plates 74 and 76 which act as capacitive deflection plates which deflect the beam 68 in the same direction as the magnetic deflection. Resistor 78 is chosen so that the reactance of the blanking apparatus 10 matches the impedance of coaxial feedline 54, which in turn matches the output impedance of driver-amplifier 52.

By combining the effect of capacitance and magnetic deflection, the drive current and voltage levels can be significantly reduced as compared to individual magnetic or capacitive deflection. In addition, unwanted pulse reflections can be avoided. These improvements are achieved by employment of the following concepts: first, reflections are minimized by sending the drive pulses through transmission lines and by using deflection elements which terminate the lines with their own characteristic impedance. The simplest approach to such impedance matching is to employ a coaxial cable 54 as indicated, in combination with the termination, impedance matching resistor 78. The upper limit of blanking frequency is where the reactive impedance of the blanking apparatus 50 becomes comparable to the impedance of resistor 78. With a 50 ohm cable 54, this occurs at about 500 megahertz. The upper frequency limit is thus about twice that of untuned capacitive or magnetic deflection systems. The effects of the electrostatic and magnetic deflection on the beam are approximately equal. In theory, the electrostatic deflection would be about three times the magnetic deflection, but the large unavoidable stray capacitance brings the effect of electrostatic deflection approximately equal to the magnetic deflection.

FIG. 4 illustrates twin differential driver-amplifiers 56 and 58 respectively connected through coaxial cables 60 and 62 to the inner corners of plate 68 and 64. By the use of twin differential driver-amplifiers as indicated, either their deflection amplitude or the deflection speed for blanking can be increased by a factor of 2.

In summary, the blanking apparatus 50 and its drive permits either a reduction in the drive requirements (per driver-amplifier) by a factor of 4 or an increase in blanking speed by a factor of 4 over conventional approaches. For example, with a pair of ultra-fast, commercially available operational amplifiers, Gaussian beams can be blanked at about 1 nanosecond. Such amplifiers are available from National Semiconductor and are identified as type LH0063. Such amplifiers have outputs in the order of 5 to 10 volts into 50 ohm loads and possess slew rates as high as 6,000 volts per microsecond. Such amplifiers are suitable for this application.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A beam deflection apparatus for deflecting a charged particle beam as the beam moves along a beam path, said apparatus comprising:

upper and lower conductors respectively positioned along the beam path with respect to the travel of particles along the beam path, said upper and lower conductors each being configured and positioned to pass the charged particle beam along its path;

first and second capacitive deflection plates positioned respectively on laterally opposite sides of the beam path;

resistive connection means connected between said upper and lower conductors;

said upper conductor being connected to said first capacitive deflection plate and said lower conductor being connected to said second capacitive deflection plate; and means for connecting electrical deflection energy to said upper and lower conductors for causing a continuous circuit through said upper and lower conductors and said resistive connection means for providing magnetic deflection of the charged particle beam and for charging up said first and second capacitive deflection plates for electrostatic deflection of the charged particle beam.

2. A beam deflection apparatus for deflecting a charged particle beam as the beam moves along the beam path, said apparatus comprising:

upper and lower conductors respectively positioned laterally from the beam path with respect to the travel of particles along the beam path, said upper and lower conductors each being configured and positioned to pass the charged particle beam along its path;

first and second capacitive deflection plates positioned substantially parallel to each other, on opposite sides of the beam path;

resistive connection means connected between said upper and lower conductors;

said upper conductor being connected to said first capacitive deflection plate and said lower conductor being connected to said second capacitive deflection plate; and means for connecting electrical deflection energy to said upper and lower conductors for causing a continuous circuit through said upper and lower conductors and said resistive connection means for providing magnetic deflection of the charged particle beam and for charging up said first and second capacitive deflection plates for electrostatic deflection of the charged particle beam.

3. The beam deflection apparatus of claim 2 wherein said upper and lower conductors are upper and lower deflection plates each with a beam opening therethrough.

4. The beam deflection apparatus of claim 3 wherein said first and second capacitive deflection plates are respectively secured to said upper and lower deflection plates and said means for connecting are connected to said upper and lower deflection plates.

5. The beam deflection apparatus of claim 4 wherein a deflection amplifier is connected to said means for connecting.

6. A beam deflection apparatus for deflecting a charged particle beam as the beam moves along a beam path, said apparatus comprising:

upper and lower deflection plates each having a beam opening therethrough, said upper and lower deflection plates being positioned to pass the charged particle beam through the openings in said upper and lower deflection plates;

first and second capacitive deflection plates positioned respectively on the laterally opposite sides of the beam path, said first and second capacitive deflection plates being respectively connected to said upper and lower deflection plates;

resistive connection means connected between said upper and lower conductors; and first and second deflection amplifiers connected to said upper and lower deflection plates.

7. A beam deflection apparatus for the deflection of a charged particle beam from a beam path comprising:

an upper conductor extending across the beam path closer to the beam source and a lower conductor extending across the beam path away from the beam source, connection means on both of said conductors for connection to a source of deflection current;

a resistive connection between said conductors on the opposite side of the beam paths from said connection means to form an impedance matched magnetic deflection loop;

a first capacitive deflection plate extending substantially parallel to the beam path on one side thereof and connected to the adjacent upper conductor; and a second capacitive deflection plate substantially parallel to said first capacitive deflection plate and positioned on the other side of the beam path and connected to the lower conductor so that upon energization of the conductors, magnetic and capacitive deflection of the charged particle beam is achieved.

8. The beam deflection apparatus of claim 7 wherein an amplifier is connected to a transmission line and said transmission line is connected to said conductors, the reactance of said conductors, said resistive connection and said capacitive plates being matched to the reactance of said connection line.

9. The beam deflection apparatus of claim 8 wherein there are first and second deflection amplifiers respectively connected to first and second transmission lines, said first and second transmission lines being respectively connected to said first and second conductors.

10. The beam deflection apparatus of claim 7 wherein said first and second conductors respectively comprise first and second transverse plates positioned across the beam path and having beam openings therein, said first and second capacitive deflection plates being secured respectively thereto at substantially right angles.

11. A method for the deflection of a charged particle beam which travels along a beam path comprising the steps of:

positioning a loop comprising a serially connected first conductor, resistor and second conductor in a plane substantially parallel to the beam path;

connecting a driver-transmission line to the first and second conductors with the values of the amplifier, transmission lines, first and second conductors and resistor such that impedance is substantially matched;

connecting first and second capacitive deflection plates to the first and second conductors on opposite sides of the beam path;

energizing the first and second conductors from the driver through the transmission line to pass current through the loop and charge the capacitive deflection plates to deflect the beam from its path.

12. The method of claim 11 further including a blanking aperture along the beam path positioned so that deflection of the beam away from its path deflects the beam away from the blanking aperture so that the deflection step is a blanking step.

* * * * *